United States Patent [19]
Cady et al.

[11] 4,393,578
[45] Jul. 19, 1983

[54] METHOD OF MAKING SILICON-ON-SAPPHIRE FET

[75] Inventors: William R. Cady, Scotia; SePuan Yu; John R. Eshbach, both of Schenectady, all of N.Y.

[73] Assignee: General Electric Company, Schenectady, N.Y.

[21] Appl. No.: 360,548

[22] Filed: Mar. 22, 1982

Related U.S. Application Data

[62] Division of Ser. No. 109,174, Jan. 2, 1980, abandoned.

[51] Int. Cl.³ .................. H01L 21/225; H01L 21/308
[52] U.S. Cl. .................. 29/576 B; 29/571; 148/1.5; 148/187; 357/22; 357/91
[58] Field of Search .............. 148/1.5, 187; 29/571, 29/576 B; 357/22, 91

[56] References Cited

U.S. PATENT DOCUMENTS

| | | | |
|---|---|---|---|
| 3,997,908 | 12/1976 | Schloetterer et al. | 357/22 |
| 4,173,063 | 11/1979 | Kneepkamp et al. | 29/571 |
| 4,198,250 | 4/1980 | Jecmen | 148/1.5 |
| 4,199,773 | 4/1980 | Goodman et al. | 148/1.5 |
| 4,201,603 | 5/1980 | Scott, Jr. et al. | 148/1.5 |
| 4,222,164 | 9/1980 | Triebwasser | 29/571 |
| 4,252,574 | 2/1981 | Fabula | 148/1.5 |
| 4,253,229 | 3/1981 | Yeh et al. | 29/571 |
| 4,277,883 | 7/1981 | Kaplan | 29/571 |

OTHER PUBLICATIONS

Darley et al. IEDM Tech. Digest, Washington, D.C., Dec. 1978 (62–65).

*Primary Examiner*—Upendra Roy
*Attorney, Agent, or Firm*—Donald R. Campbell; James C. Davis, Jr.; Marvin Snyder

[57] ABSTRACT

Junction and metal-semiconductor field effect transistors have a sapphire substrate to realize isolation and reduced capacitance, and have a self-aligned gate to minimize source parasitic resistance. A lightly doped, opposite conductivity type region under the channel forces carriers to flow near the silicon surface where mobility is high; this region is depleted at all times by the P-N junction built-in voltage and acts as an insulator. These devices serve as switches in high speed logic applications and as microwave amplifiers.

3 Claims, 16 Drawing Figures

METHOD OF MAKING SILICON-ON-SAPPHIRE FET

This application is a division, of application Ser. No. 109,174, filed Jan. 2, 1980 now abandoned.

BACKGROUND OF THE INVENTION

This invention relates to high speed semiconductor devices and especially to field effect transistors using silicon on sapphire material and to methods for their fabrication.

Conventional monolithic integrated circuits employing field effect transistors (FETs) are fabricated on silicon substrates, with isolation between devices being accomplished by use of P-N junctions. Spacing between the source and gate and between the gate and drain is limited by the mask to substrate alignment capability associated with the photolithographic processing. A conventional field effect structure is illustrated in FIG. 1. (The source, gate, and drain regions are indicated at 10–12; conductors to those regions at 13–15; and the channel at 16.) The switching speed of the conventional field effect transistor is severely limited by the source-to-drain feed-through capacitance associated with the P-N junction isolation, and the added channel resistance resulting from the spacing between source and gate and between gate and drain.

Silicon bipolar and silicon FET hybrid circuits are good performers at L and S band and are more cost effective than the gallium arsenide FET. However, attempts to fabricate monolithic integrated microwave amplifiers using these silicon structures have been frustrated by the high parasitic capacitances associated with the isolation of elements and the high conductor to substrate capacitances.

The principal object of this invention is to provide a device structure for improved silicon microwave amplifiers and high speed switching circuits, along with simple fabrication methods.

SUMMARY OF THE INVENTION

The improved field effect transistor structure employs a sapphire substrate which eliminates the need for P-N junction isolation; there is a reduction in source-to-drain feed-through capacitance, and a low capacitance from the source and drain conductors to a ground plane behind the substrate. On the substrate is a layer of silicon in which are formed source, channel, and drain regions of one conductivity type. The gate is self-aligned and provides minimum spacing between the source region and gate and between the gate and drain region; this minimizes the channel resistance of the device. A region of opposite conductivity silicon underlies the channel region and may extend beneath the source and drain; this region is lightly doped and sufficiently thin that the space charge depletion layer established at the junction with the channel region extends to the silicon-sapphire interface under all operating conditions. Carriers are forced to flow in the desired channel region nearer the surface where mobility is high; the lightly doped region as a consequence of being depleted acts like an insulator and does not increase the capacitance due to its presence.

One embodiment is an N-channel junction field effect transistor (P-channel devices are also possible) in which the gate region is formed by diffusion of P-type impurity from a doped polycrystalline silicon conductor. After forming layers of P-type and N-type silicon of given area dimensions on the substrate, a layer of polycrystalline silicon is deposited on the N-type silicon and a patterning mask is fabricated by photoresist and etching techniques. Using the patterning layer as a mask, the polycrystalline silicon is etched to undercut beneath the mask and define the gate conductor. The patterning layer is also used as a mask to implant impurity ions and form the heavily doped source and drain regions. Finally the wafer is annealed to activate the implanted ions and diffuse impurity from the gate conductor to form the P-type gate region. Another embodiment is an N-channel metal-semiconductor field effect transistor; the processing steps to realize a self-aligned gate are similar except that a metal layer is used instead of polycrystalline silicon which upon being annealed forms a Schottky barrier or gate with the channel region.

This device structure for logic applications has a low power delay product and is suitable for microwave monolithic integrated amplifiers.

DESCRIPTION OF THE PREFERRED EMBODIMENTS

Figure 1:
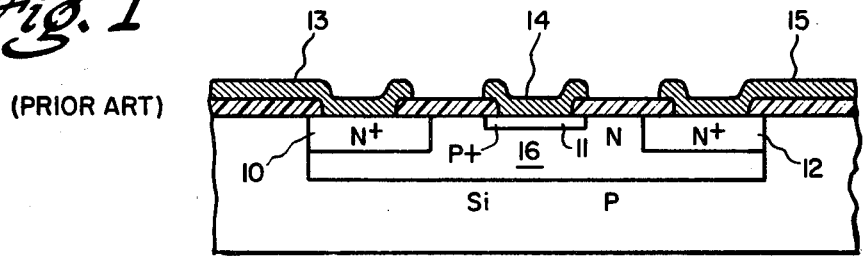
FIG. 1 is a cross sectional diagram of a prior art conventional monolithic junction field effect transistor.
Figure 2:
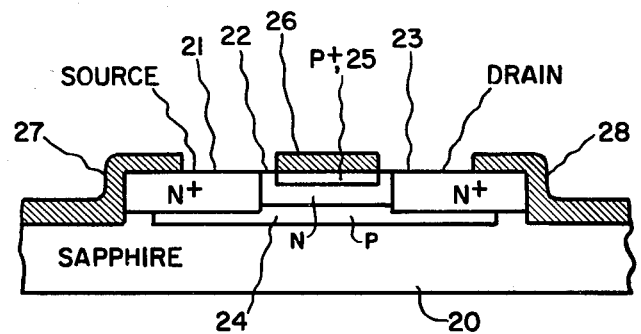
FIGS. 2 and 3 are cross-sectional and plan views of a silicon-on-sapphire junction field effect transistor.
Figure 3:
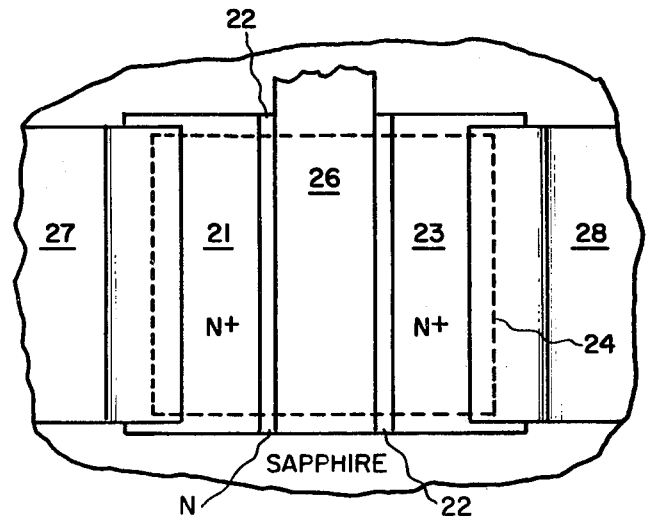

Referring to FIGS. 2 and 3, the junction field effect transistor structure is fabricated either as part of a monolithic integrated circuit or as a discrete device and uses silicon on sapphire material. The substrate 20 is single crystal sapphire, which is $\alpha$-$Al_2O_3$. The silicon "island" is a relatively thin layer having a thickness of about 1 micron. A heavily doped N+ source region 21, a moderately doped N channel 22, and a heavily doped N+ drain region 23 are formed in the surface of the silicon layer. A lightly doped, completely buried P-type silicon region 24 underlies the channel and also the source and drain regions, and insures that the channel will be remote from the silicon-sapphire interface where the silicon imperfections reduce carrier mobility and saturation velocity. The P region helps to define the channel and forces carriers to flow near the surface where their mobility is high. In the absence of any external voltages there is a built-in electric field between N channel 22 and P region 24 and a space charge depletion layer extends into both regions. The P region is lightly doped and therefore the space charge depletion layer extends all the way to the silicon-sapphire interface; this region is depleted under all operating conditions and acts like an insulator as a virtue of its low doping.

A self-aligned, heavily doped P+ gate region 25 is formed in the surface of channel 22 and is contacted by a doped polycrystalline gate conductor 26. Employing a self-aligned gate provides a minimum spacing between source and gate regions and between the gate and drain regions, and this minimizes the channel resistance of the device. Conductor metallizations 27 and 28 are deposited on the source and drain regions 21 and 23 and extend over the edge of the silicon "island" onto the surface of sapphire substrate 20. Gate conductor stripe 26 also extends over the edge and can be employed to interconnect integrated circuit elements.

Isolation of the device is accomplished in the vertical direction by sapphire substrate 20 and eliminates the need for P-N junction isolation. This results in a reduction in the source-to-drain feed-through capacitance, and there is a very low capacitance from the conductors to ground assuming that there is a ground plane beneath the sapphire. Because P region 24 is completely depleted of carriers all the time, there is no increase in the input-to-output feed-through capacitance due to its presence. The combination of reduced channel resistance and low capacitance result in a device structure which can be used to significantly improve the speed of silicon high-speed switching circuits, and makes it possible to realize silicon microwave amplifiers for L and S band applications, roughly 1–4 GHz.

Figure 4:
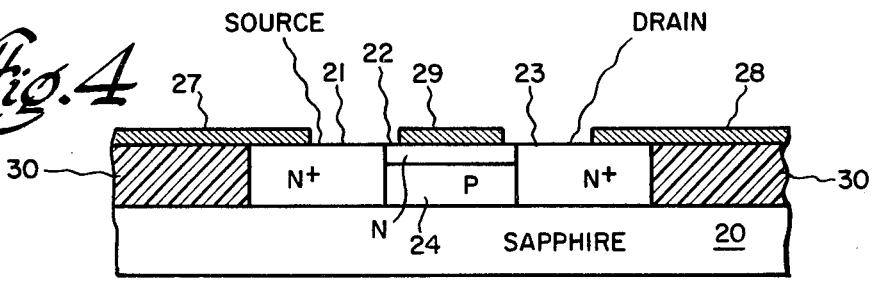
FIG. 4 is a cross section of a silicon-on-sapphire metal-semiconductor field effect transistor.
Figure 5A:
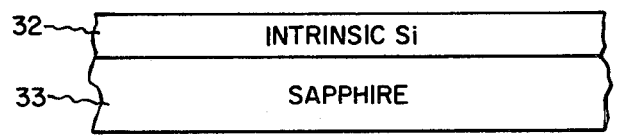
FIGS. 5a–5f show steps in the fabrication of the SOS/JFET structure in FIGS. 2 and 3.
Figure 5B:
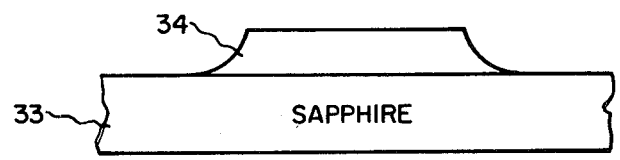
Figure 5C:
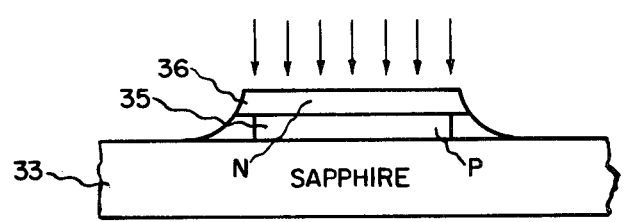
Figure 5D:
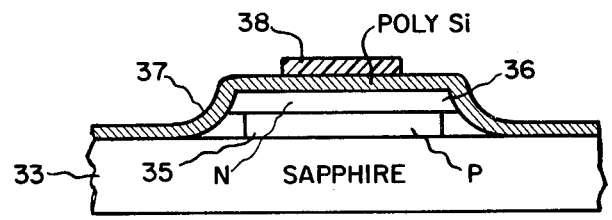
Figure 5E:
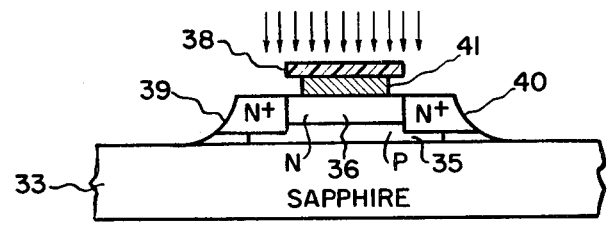
Figure 5F:
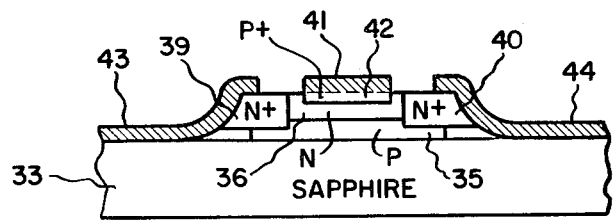

The silicon-on-sapphire metal-semiconductor or metal-Schottky field effect transistor structure in FIG. 4 is similar except that instead of the polycrystalline silicon gate conductor a metal is used to form a Schottky barrier. Source and drain grains 21 and 23 in this preferred embodiment extend all the way to the sapphire substrate and P region 24 underlies only channel 22. Gate metal 29 on the surface of the channel is also self-aligned with respect to source and drain regions 21 and 23. This is an isoplanar configuration in which the device is completely surrounded by a layer of silicon dioxide 30 or a layer of intrinsic silicon, and source and drain conductors 27 and 28 are deposited directly on the top of this material. Devices have been fabricated in which the channel region thickness is 0.25 micron and the P region thickness is 0.75 micron. Gate lengths of both 1 micron and 0.75 micron have been built and gate widths ranging from 5 microns to 1600 microns.

Device fabrication is not complex and may require the execution of only four photolithographic masking steps, none of which require a critical mask alignment. The sequence of processing steps is explained but detailed information on the individual steps themselves is not always given because conventional techniques can be employed. The silicon-on-sapphire JFET structure can be fabricated by performing the following processing steps, having reference to FIGS. 5a–5f. The starting material consists of a thin intrinsic layer of silicon 32 on a sapphire substrate 33. Using photoresist masking and etching techniques, the intrinsic silicon is selectively removed leaving an island 34 of silicon having given area dimensions. Using photoresist masking techniques, a lower lightly doped P-type layer 35 having an average impurity concentration on the order of $10^{15}$ atoms/cm$^3$ is ion implanted, and with the mask removed an upper moderately doped N-type layer 36 having an average concentration of about $10^{17}$ atoms/cm$^3$ is implanted. Assuming that the total thickness of the silicon layer is 1 micron, one set of process conditions to make the P region is that the impurity ion is boron, the dosage is $5 \times 10^{11}$/cm$^2$, and the energy is 175 Kev. To make the N region, the ion is phosphorus or arsenic, the dosage is $3-5 \times 10^{12}$/cm$^2$, and the energy is 100 Kev.

A thin layer of polycrystalline silicon 37 (FIG. 5d) which is doped with boron is deposited over the wafer surface at a temperature sufficiently low to prevent significant boron diffusion. A layer of patterning material such as SiO$_2$ or Si$_3$N$_4$ is deposited over polycrystalline silicon layer 37, and using photoresist techniques the patterning material is selectively etched to leave a patterning layer 38 that defines the conductor pattern. Using patterning layer 38 as a mask, the polycrystalline silicon is etched down to the surface of the sapphire and N silicon 36, and further etching results in undercutting of the patterning layer and produces the overhang structure illustrated in FIG. 5e. The gate conductor is indicated at 41. Again using patterning layer 38 as a mask, phosphorus ions are implanted from a vertical direction to form the N$^+$ source and drain regions 39 and 40, self-aligned to the edges of gate conductor 41. The average impurity concentration of the heavily doped source and drain regions is about $10^{20}$ atoms/cm$^3$ or greater. After removing patterning layer 38, the wafer is annealed at elevated temperatures to activate the implanted ions and diffuse boron from polycrystalline silicon gate conductor 41 to form the p$^+$ gate region 42 (FIG. 5f) and the gate P-N junction. A layer of metal, such as aluminum, is deposited on the wafer, followed by photoresist masking and etching to delineate conductor metallizations 43 and 44 which contact source and drain regions 39 and 40 and extend over the edge of the "island" onto a surface of sapphire substrate 33.

Figure 6A:
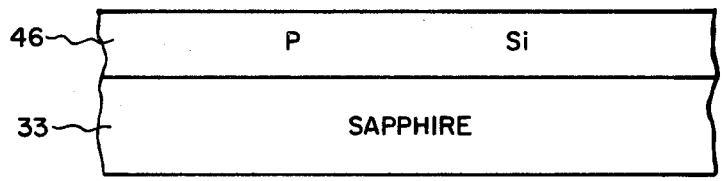
FIGS. 6a–6f show steps in the fabrication of the SOS/MESFET structure in FIG. 4.
Figure 6B:
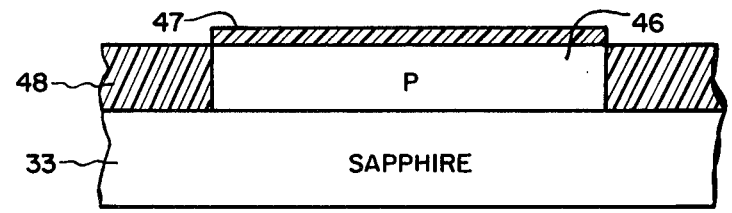
Figure 6C:
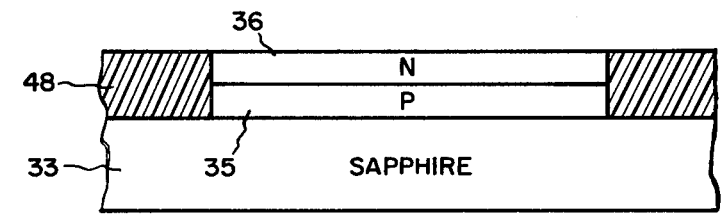

The basic silicon-on-sapphire MESFET structure can be fabricated as illustrated in FIGS. 6a–6f. The key difference between the MESFET and JFET fabrication is in the processing to form the gate; many steps are similar and are described in less detail. The starting material is a thin layer of lightly doped P-type silicon 46 on a sapphire substrate. A layer 47 of Si$_3$N$_4$ is deposited on the silicon surface, and using photoresist techniques the Si$_3$N$_4$ is etched except in the regions where the device will be subsequently formed. Using layer 47 as an oxidation mask, the exposed silicon is selectively oxidized and then removed by etching, and a second oxidation provides a planar surface. The silicon "island" is now completely surrounded by a layer of silicon dioxide 48. After etch removal of Si$_3$N$_4$ layer 47, phosphorus ions are implanted into the surface to form upper moderately doped N-type layer 36. At this point, the structure is as depicted in FIG. 6c.

Figure 6D:
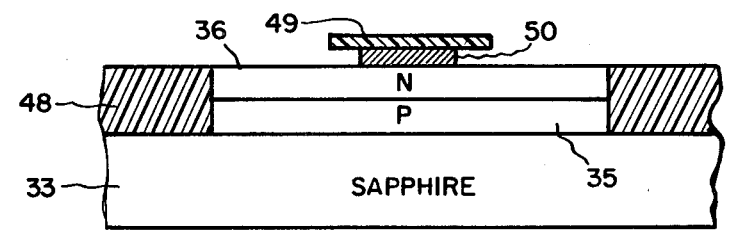
Figure 6E:
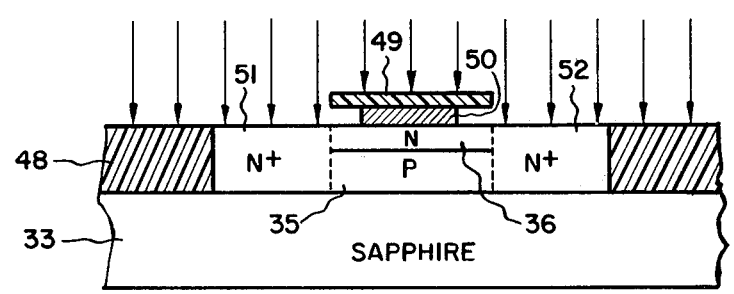
Figure 6F:
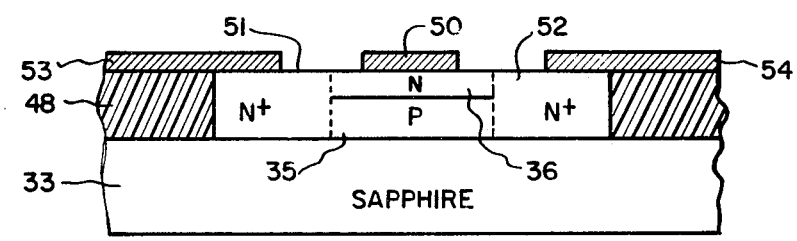

A layer of molybdenum or other metal is deposited on the wafer surface and is covered by a layer of patterning material. After etching to form patterning mask 49, the metal layer is etched and the etching is continued to undercut beneath the patterning layer and define a metal gate conductor 50 (FIG. 6d). Using patterning layer 49 as a mask, phosphorus ions are implanted and in this case N$^+$ source and drain regions 51 and 52 extend all the way to the sapphire surface and P region 35 underlies only the channel (FIG. 6e). The wafer is annealed at elevated temperature to activate the implanted ions and form the Schottky barrier at the gate metal-channel interface. Source and drain conductor metallizations 53 and 54 are added to complete the basic structure (FIG. 6f), and these conductors as well as the gate conductor are deposited directly on the surface of SiO$_2$ layer 48. This is an isoplanar device configuration.

Both the JFET and MESFET can be fabricated with: (1) isoplanar isolation, i.e., SiO$_2$ between elements, (2) air isolation between islands, or (3) intrinsic silicon between elements.

The silicon metal-semiconductor field effect transistor is of interest for logic applications due to the low power delay product which can be attained. In addition, this device is relatively easy to fabricate and it scales well to short gate lengths. Fabricating the MESFET structure using silicon-on-sapphire instead of bulk silicon, results in the advantages that the conductor to substrate capacitance can be reduced to a negligible level and that device and circuit fabrication is less complex. The need for thick oxide layers is eliminated and isolation of elements is simplified. Previous attempts to fabricate monolithic integrated microwave amplifiers using prior art silicon structures have been frustrated by the high parasitic capacitances associated with the isolation of elements and the high conductor to substrate capacitances. Fabricating the MESFET on a silicon-on-sapphire substrate instead of bulk silicon alleviates these problems and provides a viable approach to the monolithic microwave structure.

While the invention has been particularly shown and described with reference to preferred embodiments thereof, it will be understood by those skilled in the art that various changes in form and details may be made therein without departing from the spirit and scope of the invention.

The invention claimed is:

1. The method of making a silicon-on-sapphire junction field effect transistor structure comprising the steps of:

forming on a sapphire substrate lower and upper opposite conductivity type silicon layers having given area dimensions, said lower layer being lightly doped and said upper layer moderately doped;

depositing on said upper silicon layer a layer of doped polycrystalline silicon and fabricating thereon a patterning layer;

etching said polycrystalline silicon to undercut beneath said patterning layer and define a gate conductor;

implanting impurity ions into exposed areas of said silicon layers using said patterning layer as a mask, and removing the latter;

annealing to activate said implanted impurity ions and result in heavily doped source and drain regions which are self-aligned with said gate conductor and have a channel region therebetween, said annealing further diffusing impurity atoms from said polycrystalline silicon gate conductor to create a gate region of opposite conductivity type as said channel region; and depositing conductor metallizations on said source and drain regions.

2. The method of making a silicon-on-sapphire metal-semiconductor field effect transistor structure comprising the steps of:

forming on a sapphire substrate a lower P-type and an upper N-type silicon layer having given area dimensions, said lower layer being lightly doped and said upper layer moderately doped;

depositing on said upper silicon layer a layer of metal and fabricating thereon a patterning layer;

etching said metal layer to undercut beneath said patterning layer and define a gate conductor;

implanting impurity ions into exposed areas of said silicon layers using said patterning layer as the mask, and removing the latter;

annealing to activate said implanted impurity ions and produce heavily doped source and drain regions which are self-aligned with said gate metal and have a channel region therebetween, said annealing further forming a Schottky barrier at the gate metal-channel interface; and depositing conductor metallizations on said source and drain regions.

3. The method of claim 2 wherein the doping and thickness of said lower silicon layer are such that said lower layer is depleted of charge carriers by the P-N junction built-in voltage under all operating conditions and acts as an insulator.

* * * * *